United States Patent
Yamauchi et al.

(10) Patent No.: US 8,149,060 B2
(45) Date of Patent: Apr. 3, 2012

(54) LOW DISTORTION AMPLIFIER AND DOHERTY AMPLIFIER USING LOW DISTORTION AMPLIFIER

(75) Inventors: Kazuhisa Yamauchi, Tokyo (JP); Hifumi Noto, Tokyo (JP); Akira Inoue, Tokyo (JP); Tomokazu Hamada, Tokyo (JP); Masatoshi Nakayama, Tokyo (JP); Kenichi Horiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 23 days.

(21) Appl. No.: 12/933,509

(22) PCT Filed: Mar. 25, 2008

(86) PCT No.: PCT/JP2008/055526
§ 371 (c)(1),
(2), (4) Date: Sep. 20, 2010

(87) PCT Pub. No.: WO2009/118824
PCT Pub. Date: Oct. 1, 2009

(65) Prior Publication Data
US 2011/0012681 A1    Jan. 20, 2011

(51) Int. Cl.
*H03F 3/68* (2006.01)
(52) U.S. Cl. .................. 330/295; 330/238; 330/302
(58) Field of Classification Search .............. 330/302, 330/238, 295
See application file for complete search history.

(56) References Cited

U.S. PATENT DOCUMENTS

| | | | |
|---|---|---|---|
| 4,592,095 A * | 5/1986 | Ohnishi et al. | 455/327 |
| 4,697,160 A * | 9/1987 | Clark | 333/103 |
| 5,568,086 A | 10/1996 | Schuss et al. | |
| 5,808,527 A * | 9/1998 | De Los Santos | 333/205 |
| 5,999,058 A | 12/1999 | Saitou et al. | |
| 7,088,204 B2 * | 8/2006 | Kanno | 333/238 |
| 7,388,427 B2 * | 6/2008 | Kim et al. | 330/51 |
| 2005/0083118 A1 | 4/2005 | Bakker | |
| 2010/0060388 A1 * | 3/2010 | Ueda | 333/236 |
| 2010/0171563 A1 * | 7/2010 | Dupuy et al. | 333/103 |

FOREIGN PATENT DOCUMENTS

| | | |
|---|---|---|
| JP | 3 145808 | 6/1991 |
| JP | 8 330873 | 12/1996 |
| JP | 10 233638 | 9/1998 |
| JP | 2005 516444 | 6/2005 |
| JP | 2005-516444 | 6/2005 |
| JP | 2008 22499 | 1/2008 |

OTHER PUBLICATIONS

Wakejima, Akio et al., "370-W Output Power GaN-FET Amplifier with Low Distortion for W-CDMA Base Stations", IEEE IMS, pp. 1360-1363, (2006).

* cited by examiner

*Primary Examiner* — Patricia Nguyen
(74) *Attorney, Agent, or Firm* — Oblon, Spivak, McClelland, Maier & Neustadt, L.L.P.

(57) ABSTRACT

Provided is a low distortion amplifier which can satisfy both securement of a setting space in a vicinity of a transistor and low impedance. The low distortion amplifier includes a short stub having a leading end thereof short-circuited with a high-frequency short-circuit element and a low-frequency short-circuit element, in which the short stub is connected to a vicinity of at least one of a gate terminal and a drain terminal of the transistor, and includes a plurality of branched lines, the plurality of branched lines each having a leading end thereof short-circuited with the high-frequency short-circuit element and the low-frequency short-circuit element.

14 Claims, 8 Drawing Sheets

TWO STUBS AND　　　TWO STUBS AND
THREE BRANCHES　　FOUR BRANCHES
(a)　　　　　　　　(b)

LOW DISTORTION AMPLIFIER AND DOHERTY AMPLIFIER USING LOW DISTORTION AMPLIFIER

TECHNICAL FIELD

The present invention relates to a low distortion amplifier which is used for amplifying a wide-band digital modulated wave without distortion, and a Doherty amplifier which uses the low distortion amplifier.

BACKGROUND ART

Rapid development of mobile wireless communication and multimedia wireless communication in recent years requires large capacity and high speed data communication. A transmission amplifier for communication is required to have low distortion characteristics, which enable wide-band digital modulated waves to be amplified without distortion.

Distortions generated in an amplifier are roughly divided into harmonic components of a carrier frequency and components which appear in the vicinity of an amplified frequency. In general, components appearing in the vicinity of the carrier frequency cause a problem in communication. The harmonic components have very different frequencies, and hence those components can be removed by an external circuit such as a filter. However, in order to remove the components appearing in the vicinity of the carrier frequency, a very narrow band filter is required, which is difficult to realize in general.

Distortion appearing in the vicinity of the carrier frequency is generated when the high frequency signal to be amplified is modulated, and the modulation frequency causes a temporal change of the envelope. Further, this distortion is classified into two types including nonlinear distortion due to nonlinearity of the amplifier and memory effect distortion in which a past state of the amplifier is memorized and affects a current state like hysteresis characteristic.

The nonlinear distortion is caused by nonlinearity of the AM/AM characteristic or AM/PM characteristic of the amplifier at the carrier frequency. The memory effect distortion is generated in the case where distortion generated at other frequencies than the carrier frequency is cross-modulated with the carrier signal or the case where generation of distortion is different depending on a manner of a temporal change of the waveform. It is considered that the memory effect distortion is caused by an influence of heat, frequency characteristic of the amplifier, cross modulation with the harmonic component, cross modulation with distortion of a baseband frequency component generated in a bias circuit, or the like.

As one of methods for reducing the memory effect distortion, there is proposed a method of reducing the impedance of the bias circuit at a baseband frequency, so as to reduce distortion of the baseband frequency component and the cross modulation distortion with the carrier signal.

FIG. 11 is an explanatory diagram illustrating a mechanism in which the memory effect distortion is generated in the amplifier by distortion of the baseband frequency component. The amplifier for communication is usually set to a bias point of the class AB or C in order to realize low power consumption in the back-off region. Therefore, an instantaneous value of a drain current flowing in the transistor varies in accordance with an instantaneous input power of an input modulated signal, and the drain current varies at the baseband frequency of the input modulated signal.

A voltage variation at the drain terminal is expressed as a product of the drain current and the impedance at the baseband frequency of the bias circuit. Therefore, a drain terminal voltage VdFET varies at the baseband frequency in accordance with the impedance of the bias circuit. Thus, the carrier signal is modulated, and the memory effect distortion is generated. According to the above-mentioned mechanism, it is considered that the memory effect distortion can be suppressed by setting the impedance of the bias circuit at the baseband frequency to a value close to zero Ω.

FIG. 12 is a structure diagram of a conventional low distortion amplifier. Two short stubs having leading ends short-circuited with a high-frequency short-circuit element and a low-frequency short-circuit element (two-way bias network) is disposed in the vicinity of the drain terminal of the FET, so as to reduce the impedance of the bias circuit at the baseband frequency. As a result, the memory effect distortion is suppressed (see, for example, Non-patent Document 1).

Non-patent Document 1: Akio Wakejima, Kohji Matsunaga, Yasuhiro Okamoto, Kazuki Ota, Yuji Ando, Tatsuo Nakayama, and Hironobu Miyamoto, "370-W Output Power GaN-FET Amplifier with Low Distortion for W-CDMA Base Stations", pp. 1360-1363, IEEE IMS2006

DISCLOSURE OF THE INVENTION

Problem to be Solved by the Invention

In Non-patent Document 1, the number of the short stubs disposed in the vicinity of the drain terminal of the transistor is increased to two from one in the conventional structure, and hence low impedance of the bias circuit at the baseband frequency is realized. In theory, if a plurality of short stubs disclosed in Non-patent Document 1 are disposed, lower impedance can be realized. In reality, however, there is a problem that only two short stubs can be disposed at most due to restriction of space in the vicinity of a transistor.

The present invention has been made to solve the above-mentioned problem, and an object thereof is to provide a low distortion amplifier which can satisfy both the securement of a setting space in the vicinity of a transistor and low impedance, and a Doherty amplifier using the low distortion amplifier.

Means for Solving the Problem

A low distortion amplifier according to the present invention includes a short stub having a leading end thereof short-circuited with a high-frequency short-circuit element and a low-frequency short-circuit element, in which the short stub is connected to a vicinity of at least one of a gate terminal and a drain terminal of a transistor, and includes a plurality of branched lines, the plurality of branched lines each having a leading end thereof short-circuited with a high-frequency short-circuit element and a low-frequency short-circuit element.

Further, a Doherty amplifier according to the present invention adopts the low distortion amplifier of the present invention to at least one of a carrier amplifier and a peak amplifier.

Effects of the Invention

According to the present invention, the lines constituting the short stub is concentrated in one line in the vicinity of the transistor, where there is a severe restriction for space, while the line is branched into the plurality of lines toward the leading end short-circuited with the high-frequency short-circuit element and the low-frequency short-circuit element. Thus, the short stub includes the plurality of lines, and hence it is possible to obtain the low distortion amplifier and the Doherty amplifier using the low distortion amplifier, which are capable of satisfying both the securement of a setting space in the vicinity of the transistor and low impedance.

BEST MODES FOR CARRYING OUT THE INVENTION

Hereinafter, preferred embodiments of a low distortion amplifier according to the present invention are described with reference to the drawings.

Embodiment 1

Figure 1:
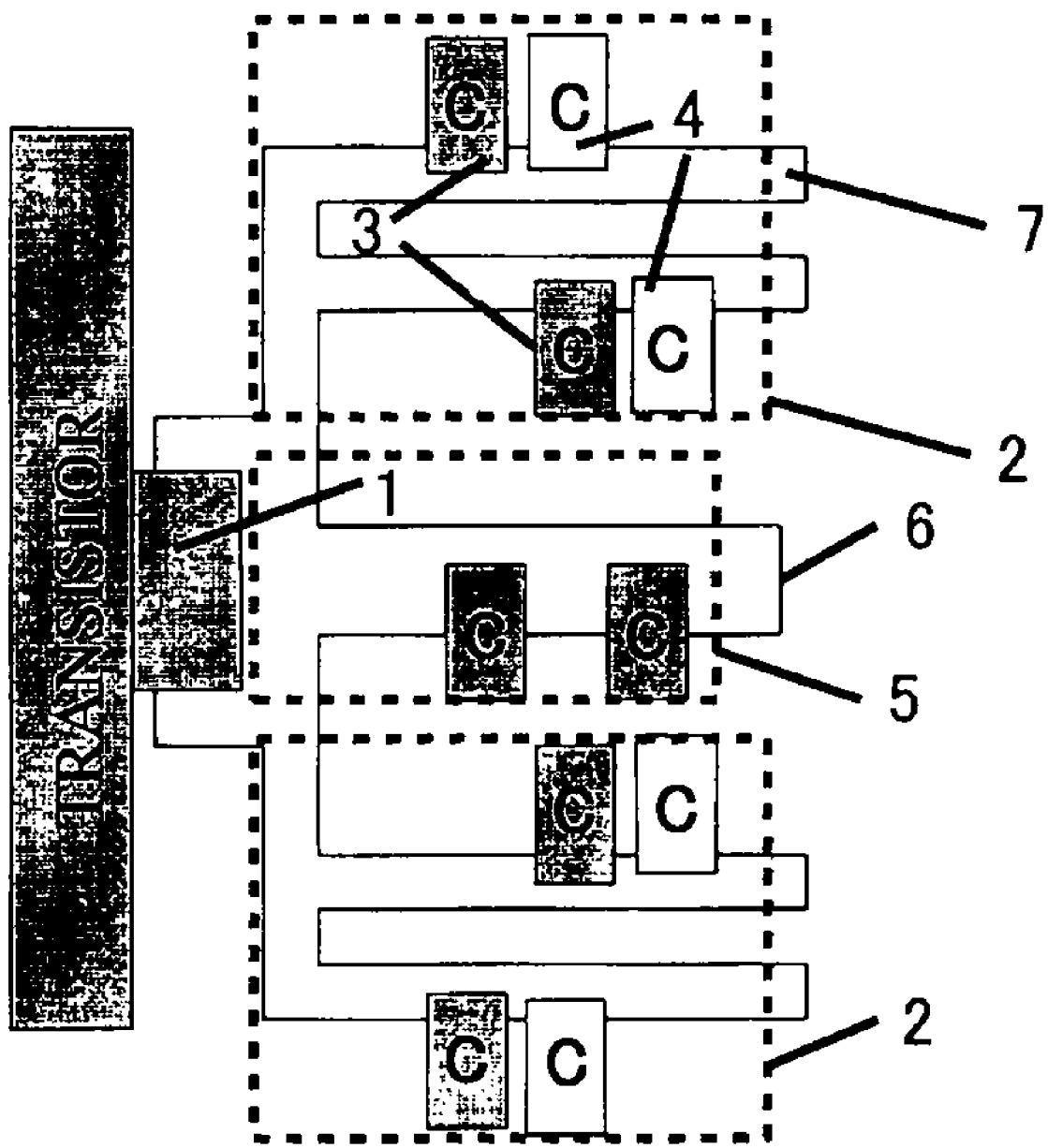
FIG. 1 A structure diagram of a low distortion amplifier according to Embodiment 1 of the present invention.

FIG. 1 is a structure diagram of a low distortion amplifier according to Embodiment 1 of the present invention. More specifically, FIG. 1 illustrates an output circuit of a transistor of the low distortion amplifier. The low distortion amplifier illustrated in FIG. 1 includes a drain terminal 1 of the transistor, short stubs 2, high-frequency short-circuit capacitors 3, low-frequency short-circuit capacitors 4, an output matching circuit 5, an output terminal 6, and a microstrip line 7.

Note that, in the figure, a black rectangle with sign C means the high-frequency short-circuit capacitor 3, and a white rectangle with sign C means the low-frequency short-circuit capacitor 4. In addition, the high-frequency short-circuit capacitor 3 corresponds to the high-frequency short-circuit element, and the low-frequency short-circuit capacitor 4 corresponds to the low-frequency short-circuit element. This applies to other embodiments and figures below.

In this case, the short stub 2 has a feature that the line thereof is branched into a plurality of lines, and the leading ends thereof are short-circuited with the high-frequency short-circuit capacitor 3 and the low-frequency short-circuit capacitor 4. In addition, the high-frequency short-circuit capacitor 3 and the low-frequency short-circuit capacitor 4 used in the short stub 2 or the output matching circuit 5 are connected to the ground by a through hole. Capacitors illustrated in other figures after FIG. 1 are also short-circuited to the ground via a through hole.

Next, an operation of the low distortion amplifier in Embodiment 1 is described. An instantaneous value of a drain current flowing in the transistor varies in accordance with instantaneous input power of a modulated signal supplied to the transistor. The short stub 2 has the leading end that is short-circuited with the high-frequency short-circuit capacitor 3 and the low-frequency short-circuit capacitor 4, and hence an impedance corresponding to the capacitor is reduced.

In addition, the line of the short stub 2 is branched to a plurality of lines, and hence an inductance corresponding to the line is reduced. Thus, the impedance of the short stub 2 is reduced. The memory effect distortion is generated when the drain terminal voltage varies in accordance with the impedance of the short stub 2 at the baseband frequency. Therefore, the memory effect distortion can be reduced by reducing the impedance of the short stub 2.

Figure 2:
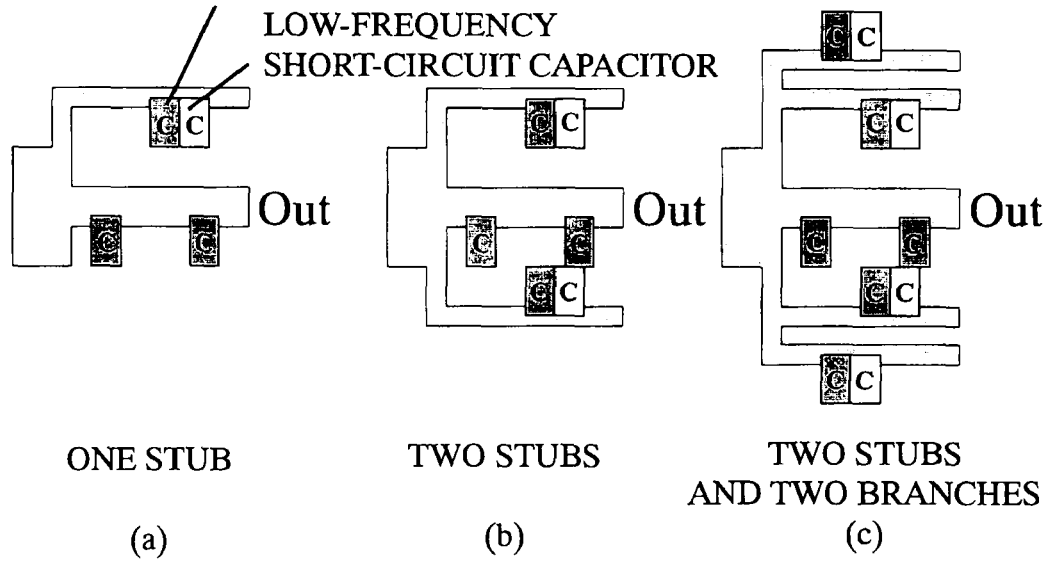
FIG. 2 Diagrams illustrating prototype patterns of a short stub 2 according to Embodiment 1 of the present invention.

Next, reduction of impedance at the baseband frequency by the short stub 2 is described in detail. FIG. 2 illustrate prototype patterns of the short stub 2 according to Embodiment 1 of the present invention. FIG. 2(a) illustrates a case where the short stub 2 is added by one. Further, FIG. 2(b) illustrates a case where the short stub 2 is added by two. Further, FIG. 2(c) illustrates a case where the short stub 2 is added by two, and each of the short stubs 2 is branched into two.

Figure 3:
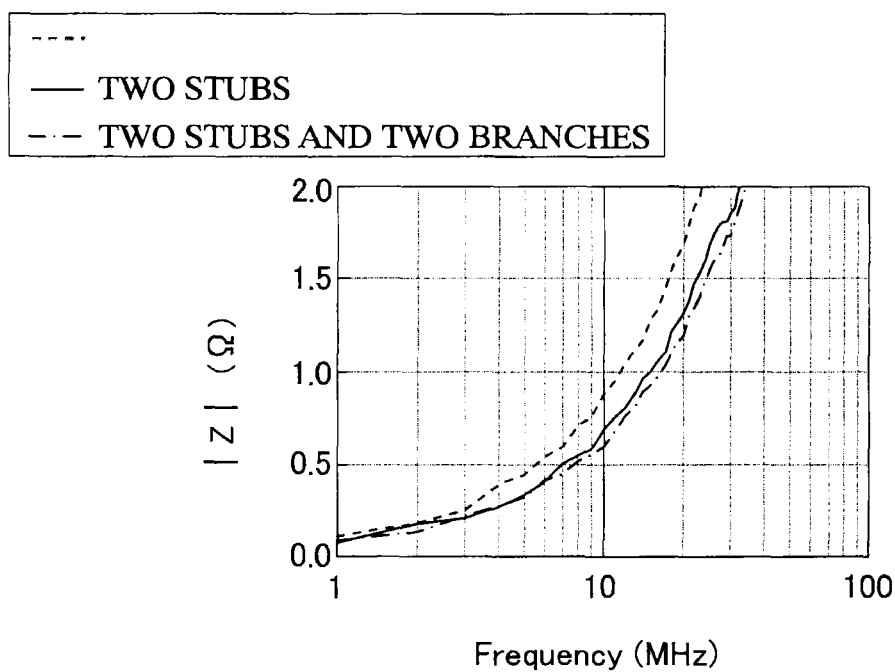
FIG. 3 A result of measurement of impedance characteristics with respect to a baseband frequency according to Embodiment 1 of the present invention.

The three types of short stubs 2 as illustrated in FIG. 2 were manufactured by way of trial, and impedance at the baseband frequency was measured for each of the short stubs. FIG. 3 shows a result of the measurement of impedance characteristics at the baseband frequency according to Embodiment 1 of the present invention. It can be confirmed that the impedance is reduced by increasing the number of the added short stubs 2 from one to two.

Further, it is understood that the impedance is further reduced by branching each of the two added short stubs 2 into two. From this result, too, it is understood that the short stub of the present invention is effective.

Figure 4:
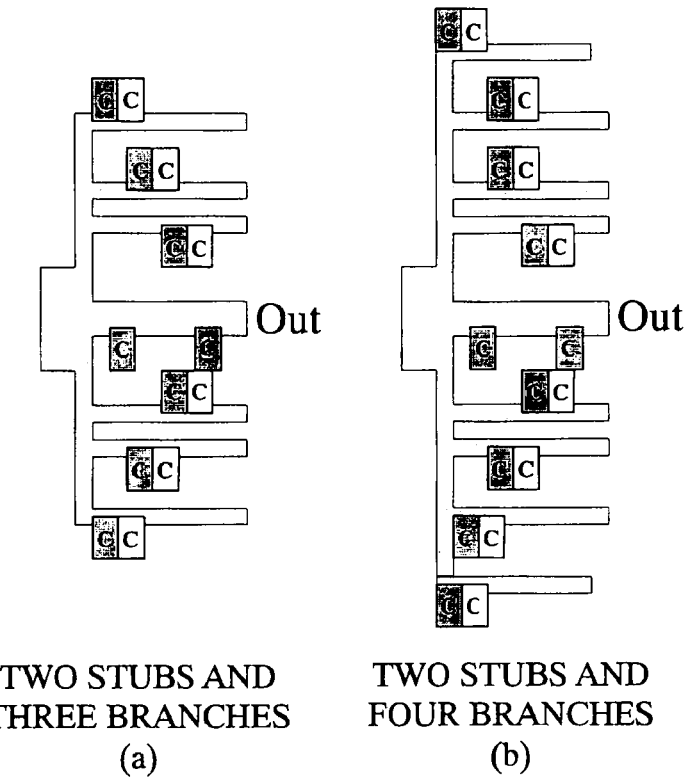
FIG. 4 Diagrams illustrating examples of increasing the number of branches of the short stub 2 according to Embodiment 1 of the present invention.

FIG. 2(c) illustrates the output matching circuit in which each of the two added short stubs 2 is branched into two, but the number of branches may be increased more. FIG. 4 are diagrams illustrating examples of increasing the number of branches of the short stub 2 according to Embodiment 1 of the present invention. FIG. 4(a) illustrates a case where the short stub 2 is added by two, and each of the short stubs 2 is branched into three. Further, FIG. 4(b) illustrates a case where the short stub 2 is added by two, and each of the short stubs 2 is branched into four. In this way, by increasing the number of branches, the impedance can be further reduced.

Figure 5:
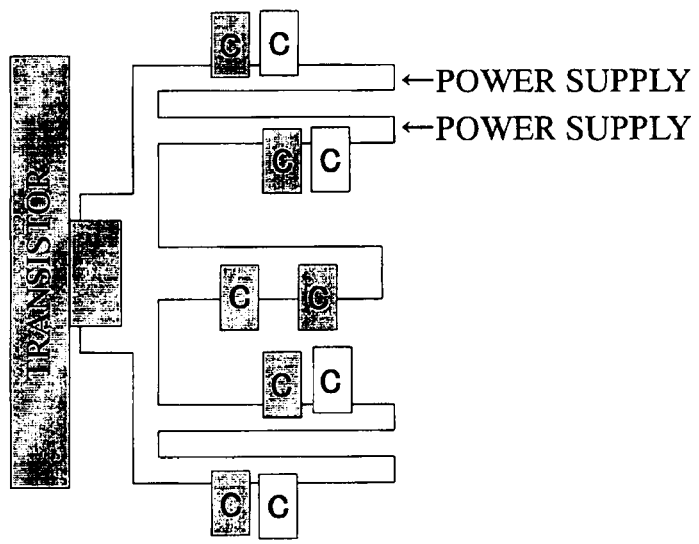
FIG. 5 An explanatory diagram illustrating supply of bias voltage to be applied from the short stub to a transistor according to Embodiment 1 of the present invention.

In addition, from such a short stub, a bias voltage to be applied to the transistor may be supplied. FIG. 5 is an explanatory diagram illustrating supply of a bias voltage to be applied from the short stub to the transistor according to Embodiment 1 of the present invention. In this way, by supplying the bias voltage from the short stub, the low impedance function and the bias supply function can be shared at the baseband frequency.

In the present invention, the short stub is constituted of a plurality of lines. Therefore, an effective line width of a bias supply line can be increased, and a DC resistance of the short stub can be reduced even if the bias is supplied from one side. Thus, a loss in the bias circuit can be reduced, and high efficiency of the amplifier can be realized.

In addition, it is not necessary to supply the bias voltage to be applied from the short stub to the transistor. In this case, there is no influence of the DC resistance, and hence a thin line can be used. As a result, an area for the branched lines can be reduced, thereby enabling the number of branches to be increased. Thus, impedance at the baseband frequency can be further reduced. In addition, the arrangement of the short stubs has flexibility, and hence various arrangements can be adopted in accordance with a substrate layout.

Figure 6:
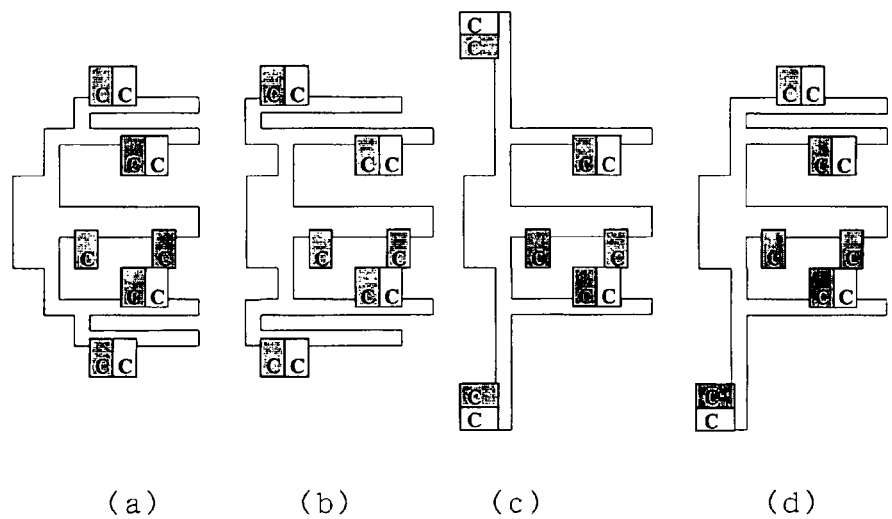
FIG. 6 Diagrams illustrating examples of an output matching circuit constituted of two short stubs with two branches according to Embodiment 1 of the present invention.

FIG. 6 are diagrams illustrating examples of the output matching circuit constituted of two short stubs with two branches according to Embodiment 1 of the present invention, in which four types (a) to (d) are illustrated. As illustrated in FIGS. 6(a) to 6(d), it is not necessary that the arrangement directions of the short stubs are the same direction, and it is not necessary that the short stubs are symmetric with respect to a main line. In addition, the short stub may be branched again after branched once.

Further, if a direct current is blocked between the transistor and the short stub, the short stub leading end may be connected directly to the ground without using a capacitor. Thus, good short-circuit characteristics can be realized.

In addition, FIG. 1 illustrates the example in which the short stub is connected to the output side of the transistor, but the short stub may be connected to the input side of the transistor. If the short stub is connected to the input side in this way, impedance can be reduced for a signal of the baseband frequency leaking from the output side or a signal of the baseband frequency generated by nonlinearity of gate capacity on the input side of the transistor, thereby reducing voltage variation on the gate terminal of the transistor.

The signal at the baseband frequency is cross-modulated with the carrier in the transistor, and the memory effect distortion occurs. Therefore, low impedance on the input side at the baseband frequency has an advantage that the memory effect distortion in the amplifier can be reduced.

Further, FIG. 1 described above illustrates the example in which the microstrip line is used as the line constituting the short stub. However, as a line constituting the short stub, at least one of an inductor of concentrated constant, a strip line, a wire, a triplate line, and a coplanar line may be used for constituting the same. By using them, it is possible to reduce the size, which is effective particularly when the frequency is low.

As described above, according to Embodiment 1, the line constituting the short stub is concentrated in one line in the vicinity of the transistor where there is a severe restriction for space, while the line is branched into a plurality of lines toward the leading end short-circuited with the high-frequency short-circuit element and the low-frequency short-circuit element. In this way, by forming the short stub with a plurality of lines, the low distortion amplifier can be obtained, which can satisfy both the securement of a setting space in the vicinity of a transistor and the low impedance.

Note that, in Embodiment 1 described above, description has been given of the case where the short stub is disposed outside a transistor package. However, the low distortion amplifier of the present invention is not limited to this structure. The short stub may be formed inside the transistor package or formed integrally with the transistor on the semiconductor. With this structure, impedance at the baseband frequency can be reduced in the close vicinity of the intrinsic transistor. As a result, it is possible to obtain the low distortion amplifier with further-reduced memory effect distortion.

Embodiment 2

In Embodiment 2, the case where the low-frequency short-circuit point is disposed in the close vicinity of the high-frequency short-circuit point of the short stub is described with reference to FIG. 1 described above. In the structure illustrated in FIG. 1, the high-frequency short-circuit capacitor 3 corresponds to the high-frequency short-circuit point, and the low-frequency short-circuit capacitor 4 corresponds to the low-frequency short-circuit point.

The fundamental operation is the same as that of Embodiment 1 described above. By disposing the low-frequency short-circuit point (low-frequency short-circuit capacitor 4) in the close vicinity of the high-frequency short-circuit point (high-frequency short-circuit capacitor 3), the low-frequency short-circuit point can be made closest to the transistor. Thus, the impedance of the line constituting the short stub can be minimized. Further, along with reduction of the impedance of the short stub, the low distortion amplifier with small memory effect distortion can be realized.

As described above, according to Embodiment 2, the low-frequency short-circuit point is disposed in the close vicinity of the high-frequency short-circuit point of the short stub. Thus, the impedance of the line constituting the short stub can be minimized, and hence the low distortion amplifier with small memory effect distortion can be realized.

Embodiment 3

In Embodiment 3, the case where the high-frequency short-circuit points are disposed at positions of the short stubs, where an electric length from a connection point with the main line is the same, is described with reference to FIG. 1 described above. In the structure illustrated in FIG. 1, the high-frequency short-circuit capacitor 3 corresponds to the high-frequency short-circuit point, and the low-frequency short-circuit capacitor 4 corresponds to the low-frequency short-circuit point.

Further, in FIG. 1, the two high-frequency short-circuit points (high-frequency short-circuit capacitors 3) disposed in the short stub 2 on the upper side and the two high-frequency short-circuit points (high-frequency short-circuit capacitors 3) disposed in the short stub 2 on the lower side are disposed at positions having the same electric length from the connection point with the main line.

The fundamental operation is the same as that of Embodiment 1 described above. Impedance of the short stub is affected most when the short stub has a shortest electric length from the connection point with the main line, and this electric characteristic of the stub determines a general characteristic of the whole of the stubs. Therefore, by making the electric lengths of stubs constituting the short stub uniform, a total sum of impedance of lines constituting the short stub can be minimized.

Therefore, in each short stub, the high-frequency short-circuit point is disposed at a position of the same electric length from the connection point with the main line, and hence low impedance can be achieved for the whole of the short stubs. As a result, the low distortion amplifier having small memory effect distortion can be realized.

As described above, according to Embodiment 3, the high-frequency short-circuit points are disposed at positions having the same electric length from the connection point of the short stubs with the main line. Thus, low impedance can be achieved for the whole of the short stubs, and hence the low distortion amplifier with small memory effect distortion can be realized.

Embodiment 4

Figure 7:
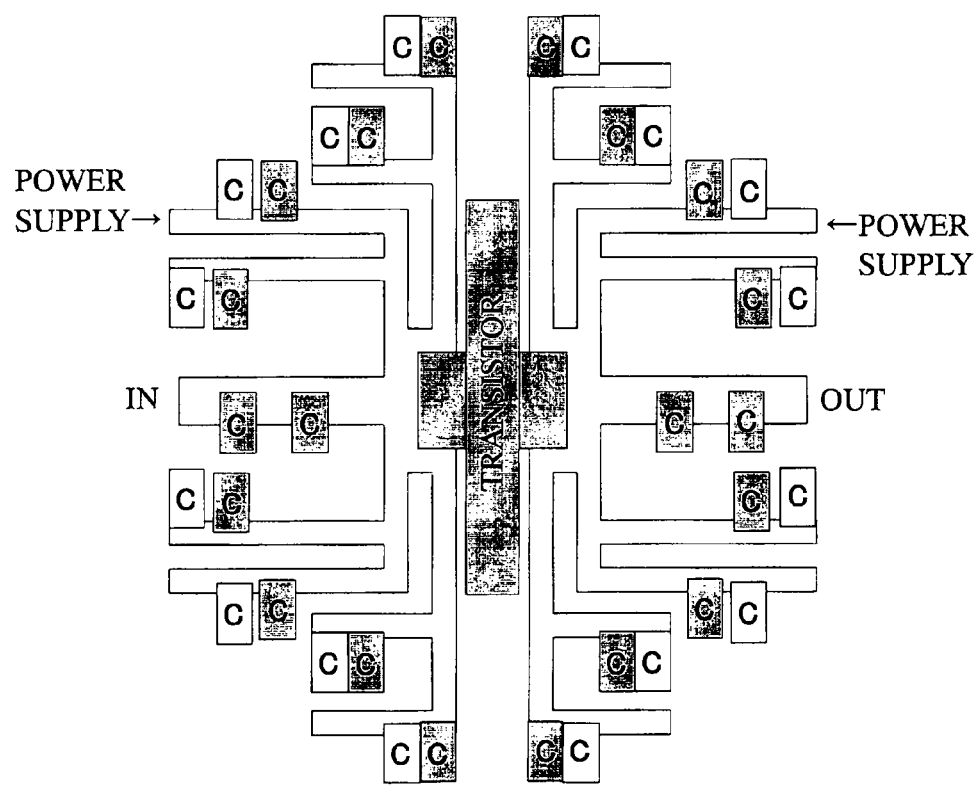
FIG. 7 A structure diagram of a low distortion amplifier according to Embodiment 4 of the present invention.

FIG. 7 is a structure diagram of a low distortion amplifier according to Embodiment 4 of the present invention. In the low distortion amplifier illustrated in FIG. 7, two short stubs are connected to each of the vicinities of the gate terminal and the drain terminal of the transistor.

The fundamental operation is the same as that of Embodiment 1 described above. A plurality of short stubs are connected to the gate terminal and the drain terminal of the transistor, so as to obtain the advantage that impedance at the baseband frequency can be further reduced. Thus, the memory effect distortion can be further reduced.

As described above, according to Embodiment 4, a plurality of short stubs are connected to the gate terminal and the drain terminal of the transistor. Thus, the impedance at the baseband frequency can be further reduced, thereby enabling realization of the low distortion amplifier having further-reduced memory effect distortion.

Embodiment 5

Figure 8:
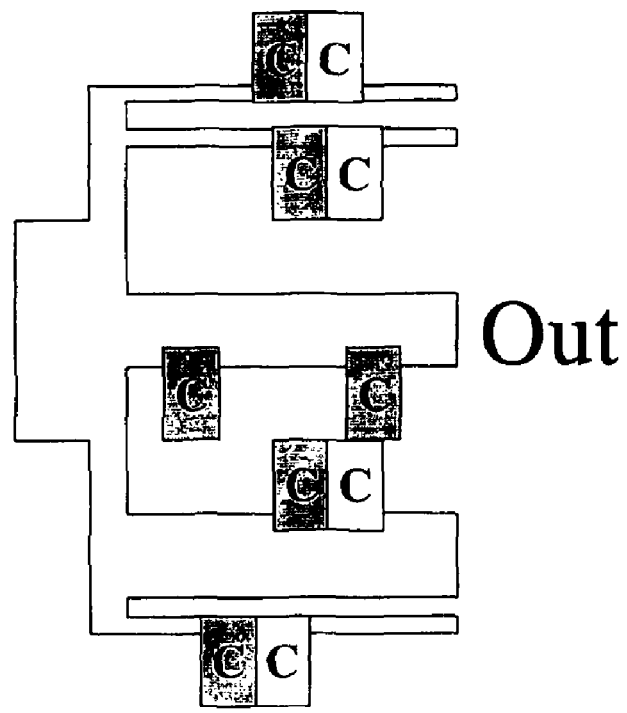
FIG. 8 A structure diagram of a low distortion amplifier according to Embodiment 5 of the present invention.

FIG. 8 is a structure diagram of a low distortion amplifier according to Embodiment 5 of the present invention. In the low distortion amplifier according to Embodiment 5, the line width of the short stub is different between before and after branching.

The fundamental operation is the same as that of Embodiment 1 described above. If the line width of the short stub after the branching is smaller than the line width of the short stub before the branching, the lines can be arranged at high density, which provides an advantage in that the number of branches can be increased. In contrast, if the line width of the short stub after the branching is larger than the line width of the short stub before the branching, there is an advantage in that the impedance of the line can be reduced.

Due to those advantages, the impedance of the short stub can be reduced. Note that, a thick line and a thin line may be mixed in the short stub. With this structure, memory effect distortion of the amplifier can be reduced.

As described above, according to Embodiment 5, the line width of the short stub is different between before and after the branching. Thus, the impedance of the short stub can be reduced, and hence the low distortion amplifier having reduced memory effect distortion can be realized.

Embodiment 6

Figure 9:
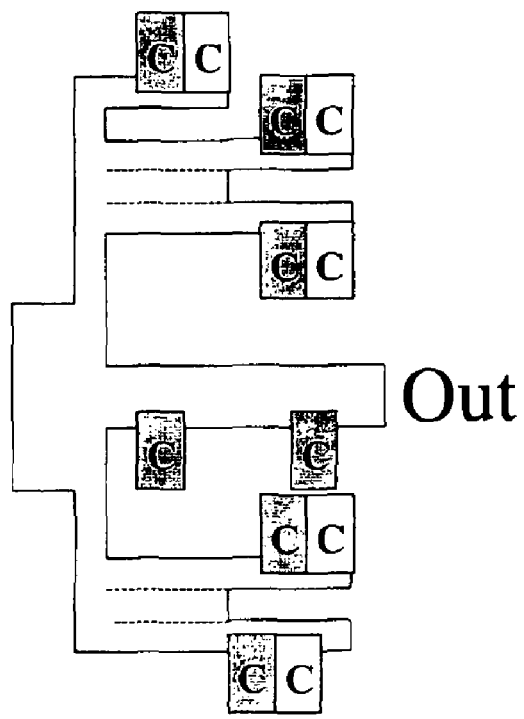
FIG. 9 A structure diagram of a low distortion amplifier according to Embodiment 6 of the present invention.

FIG. 9 is a structure diagram of a low distortion amplifier according to Embodiment 6 of the present invention. The whole or a part of a plurality of branched lines constituting the short stub is bundled so as to constitute a line of larger width. Further, the bundled line is branched again just before short-circuited with the high-frequency short-circuit element and the low-frequency short-circuit element, to thereby short-circuit the leading end of each branched line.

The fundamental operation is the same as that of Embodiment 1 described above. By bundling all or some of the plurality of branched lines constituting the short stub, a conductor can be disposed also between the plurality of branched lines, and the impedance of the line can be reduced.

In addition, the bundled line is branched again just before short-circuited with the high-frequency short-circuit element and the low-frequency short-circuit element, to thereby short-circuit the leading end of each branched line. As a result, good short-circuit characteristics can be obtained. Therefore, there is an advantage in that the impedance of the short stub can be reduced, and the memory effect distortion of the low distortion amplifier can be reduced.

As described above, according to Embodiment 6, a plurality of branched lines of the short stub are bundled and then branched again. Thus, the impedance of the short stub can be reduced, and hence the low distortion amplifier with reduced memory effect distortion can be realized.

Embodiment 7

Figure 10:
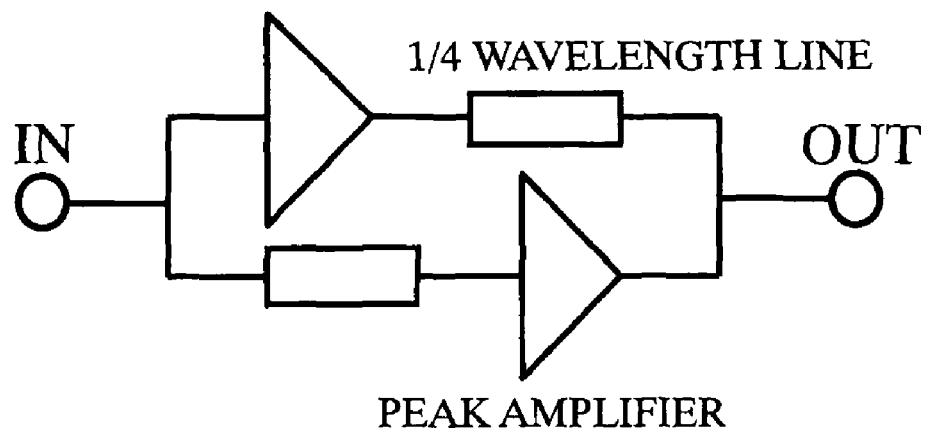
FIG. 10 A structure diagram of a Doherty amplifier using a low distortion amplifier according to Embodiment 7 of the present invention.
Figure 11:
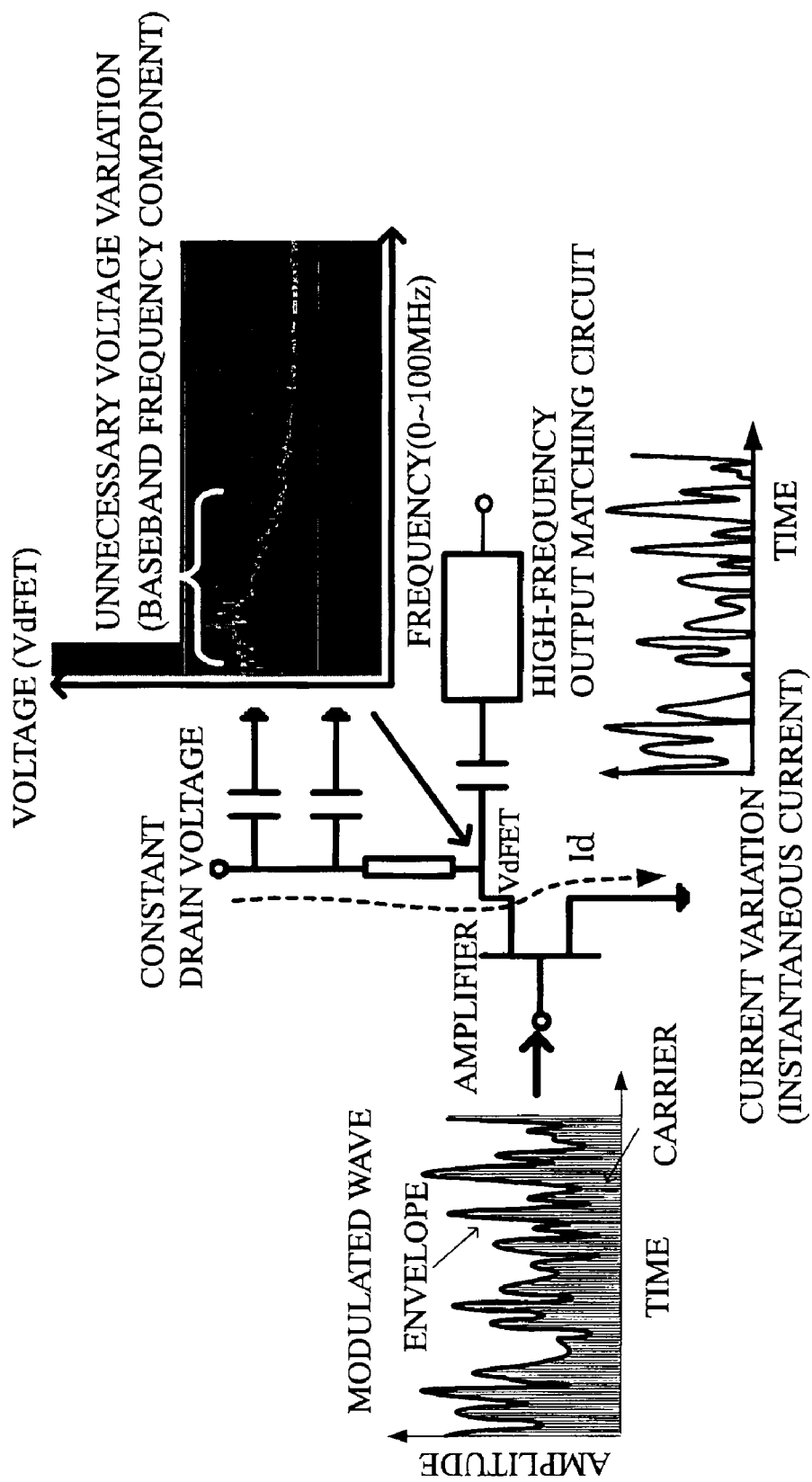
FIG. 11 An explanatory diagram illustrating a mechanism in which memory effect distortion is generated in an amplifier by distortion of a baseband frequency component.
Figure 12:
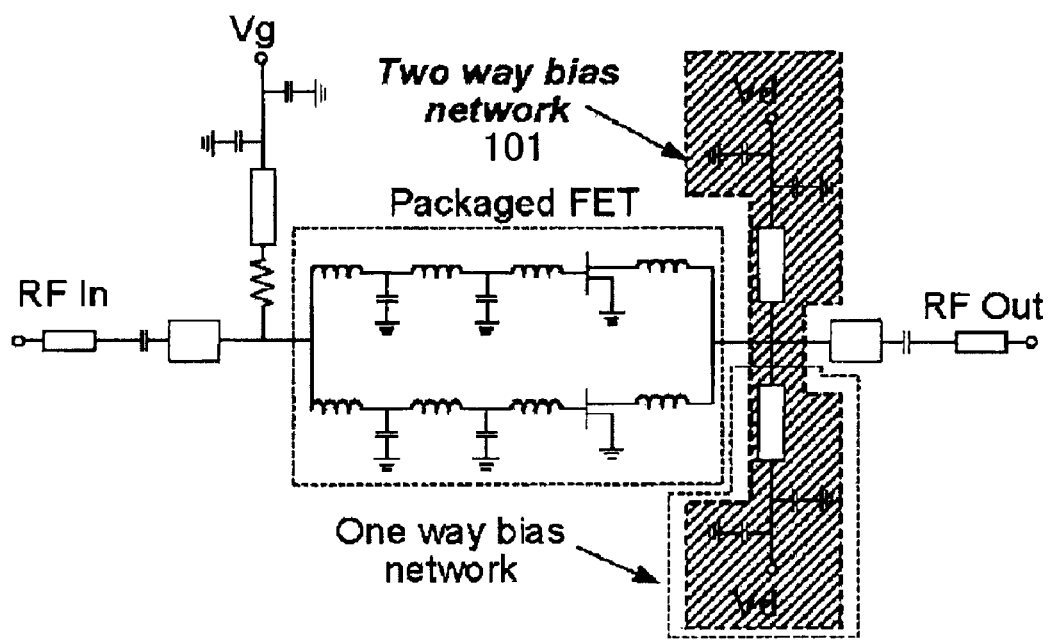
FIG. 12 A structure diagram of a conventional low distortion amplifier.

In Embodiment 7, a case where the low distortion amplifiers described above in Embodiments 1 to 6 are applied to a Doherty amplifier is described. FIG. 10 is a structure diagram of the Doherty amplifier using the low distortion amplifier according to Embodiment 7 of the present invention. More specifically, the low distortion amplifier described above in Embodiments 1 to 6 is applied to a carrier amplifier and a peak amplifier, which are components of the Doherty amplifier.

The fundamental operation of a unit amplifier (i.e., the carrier amplifier and the peak amplifier) illustrated in FIG. 7 according to Embodiment 7 is the same as that of Embodiment 1 described above. The Doherty amplifier includes the carrier amplifier and the peak amplifier. Then, in a small output range, only the carrier amplifier of the class AB operates. On the other hand, in a large output range, both the carrier amplifier of the class AB and the peak amplifier of the class C operate. By this operation, high efficiency is realized from the low output range to the high output range.

The peak amplifier operates as the class C. Therefore, instantaneous variation of the drain current is large, causing large memory effect distortion to occur. Therefore, the low distortion amplifier of the present invention is used as the peak amplifier, and hence the memory effect distortion can be reduced.

In addition, in the Doherty amplifier, different memory effect distortions are generated because the operational class is different between the carrier amplifier and the peak amplifier. Therefore, the memory effect distortion after combination becomes very complicated distortion. As a result, when a digital predistorter compensates the distortion, there occurs a problem that a distortion compensation amount is substantially decreased.

Therefore, the low distortion amplifier of the present invention is used as the carrier amplifier and the peak amplifier, and hence the memory effect distortion of the carrier amplifier and the peak amplifier can be reduced. As a result, there is an advantage in that the distortion compensation amount can be improved.

As described above, according to Embodiment 7, the low distortion amplifier of the present invention is used as the carrier amplifier and the peak amplifier that are components of the Doherty amplifier. Thus, the memory effect distortion of the carrier amplifier and the peak amplifier can be reduced, and hence the distortion compensation amount can be improved.

The invention claimed is:
1. A low distortion amplifier, comprising a short stub having a leading end thereof short-circuited with a high-frequency short-circuit element and a low-frequency short-circuit element, wherein the short stub is connected to a vicinity of at least one of a gate terminal and a drain terminal of a transistor, and includes a plurality of branched lines, the plurality of branched lines each having a leading end thereof short-circuited with a high-frequency short-circuit element and a low-frequency short-circuit element.

2. A low distortion amplifier according to claim 1, wherein the low-frequency short-circuit element is disposed in a close vicinity of the high-frequency short-circuit element in each of the plurality of branched lines of the short stub.

3. A low distortion amplifier according to claim 1, wherein the plurality of branched lines of the short stub have the same line length from a connection point with a main line to the high-frequency short-circuit element.

4. A low distortion amplifier according to claim 1, wherein a plurality of the short stubs are connected to the vicinity of the at least one of the gate terminal and the drain terminal of the transistor.

5. A low distortion amplifier according to claim 1, wherein the short stub includes a line having different line widths between before and after branching.

6. A low distortion amplifier according to claim 1, wherein all or some of the plurality of branched lines of the short stub are bundled so as to form a part with a large line width, and the part is branched into a plurality of lines again just before short-circuited, the plurality of lines each having a leading end thereof short-circuited with the high-frequency short-circuit element and the low-frequency short-circuit element.

7. A low distortion amplifier according to claim 1, wherein the short stub is formed in a package of the transistor or formed integrally with the transistor on the same semiconductor.

8. A Doherty amplifier, which uses the low distortion amplifier according to claim 1, the low distortion amplifier being adopted as at least one of a carrier amplifier and a peak amplifier.

9. A Doherty amplifier, which uses the low distortion amplifier according to claim 2, the low distortion amplifier being adopted as at least one of a carrier amplifier and a peak amplifier.

10. A Doherty amplifier, which uses the low distortion amplifier according to claim 3, the low distortion amplifier being adopted as at least one of a carrier amplifier and a peak amplifier.

11. A Doherty amplifier, which uses the low distortion amplifier according to claim 4, the low distortion amplifier being adopted as at least one of a carrier amplifier and a peak amplifier.

12. A Doherty amplifier, which uses the low distortion amplifier according to claim 5, the low distortion amplifier being adopted as at least one of a carrier amplifier and a peak amplifier.

13. A Doherty amplifier, which uses the low distortion amplifier according to claim 6, the low distortion amplifier being adopted as at least one of a carrier amplifier and a peak amplifier.

14. A Doherty amplifier, which uses the low distortion amplifier according to claim 7, the low distortion amplifier being adopted as at least one of a carrier amplifier and a peak amplifier.

* * * * *